(12) United States Patent
Miyagi

(10) Patent No.: US 6,330,204 B1
(45) Date of Patent: Dec. 11, 2001

(54) MEMORY CIRCUIT

(75) Inventor: Masanori Miyagi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/497,013

(22) Filed: Feb. 2, 2000

(30) Foreign Application Priority Data

Feb. 3, 1999 (JP) .................................................. 11-026730
Feb. 1, 2000 (JP) .................................................. 12-023590

(51) Int. Cl.[7] ...................................................... G11C 7/00
(52) U.S. Cl. .................................. 365/225.7; 365/189.04; 365/243
(58) Field of Search ........................... 365/225.7, 189.04, 365/189.09, 218, 243

(56) References Cited

U.S. PATENT DOCUMENTS 6,037,799 * 3/2000 McClure ................................. 326/37
6,052,313 * 4/2000 Atsumi et al. .................... 365/189.05

* cited by examiner

Primary Examiner—David Nelms
Assistant Examiner—Thong Le
(74) Attorney, Agent, or Firm—Adams & Wilks

(57) ABSTRACT

A memory circuit is provided which is capable of writing data with a simplified configuration and hence being improved in usability.

The present invention comprises a fuse 10 having one end to which a bias voltage Vcc is to be applied from an internal power supply to have a disconnect/connect state storing data 0/1, a thyristor 11 having an anode terminal connected to the internal power supply through the fuse 10 and a cathode terminal being ground, an N-channel MOS transistor 12 having a drain terminal connected to a gate terminal of the thyristor 11 and a source terminal being ground, and a read-out circuit 14 for reading out data 0/1 stored on the fuse 10 through the N-channel MOS transistor 13.

19 Claims, 5 Drawing Sheets

MEMORY CIRCUIT

BACKGROUND OF THE INVENTION

1. Field of the Invention

This invention relates to a memory circuit having a fuse for use in circuit trimming, one-time ROM (Read Only Memory).

2. Description of the Prior Arts

Conventionally, a memory circuit having a fuse of polysilicon or the like in the semiconductor circuit stores data having a 1/0 value depending upon the presence or absence of disconnection in the fuse. A memory circuit of this kind is one type of programmable PROM which allows a user to freely write data thereon after manufacture, and constitutes a read only memory.

FIG. 5 shows a circuit configuration of a first conventional memory circuit as stated above. In the figure, a fuse 1 forming part of a semiconductor circuit is formed of polysilicon. The fuse 1 has one end connected to an external power supply so that an external voltage Vpp (12V–20V) is applied thereto. The fuse 1 is blown out due to Joule heat produced when a certain current or greater flows through. The fuse 1 in a blown state stores data "0" while it in an unblown state stores data "1".

An N-channel MOS (Metal Oxide Semiconductor) transistor 2 serves as a switch element that decides whether to flow current though the fuse 1 or not. The N-channel MOS transistor 2 has a drain terminal connected through the fuse 1 to the external power supply (not shown) and a source terminal that is grounded. Also, the N-channel MOS transistor 2 is on/off-controlled by a disconnect (write) signal SW inputted to its gate terminal.

A sense line 3 connects between the other end of the fuse 1 (N-channel MOS transistor 2 drain terminal) and a read-out circuit 5. Another N-channel MOS transistor 4 is inserted on the sense line 3 to have its drain terminal connected to a side of the fuse 1 and its source terminal connected to a side of the read-out circuit 5. The N-channel MOS transistor 4 is to be on/off-controlled by a read signal SR inputted to the gate terminal.

The read-out circuit 5 compares a voltage on the sense line 3 with a reference voltage to read out a state of the fuse 1 (storage data) and output it as read-out data D. Specifically, the read-out circuit 5 outputs read-out data D "1" when the voltage on the sense line 3 is higher than the reference voltage. On the other hand, it outputs read-out data D "0" when the voltage on the sense line 3 is equal to or lower than the reference voltage.

In the above configuration, where storing data "0" on the memory circuit of FIG. 5, a not-shown control circuit outputs a disconnect signal SW to the gate terminal of the N-channel MOS transistor 2. This causes the N-channel MOS transistor 2 to turn on so that an external voltage Vpp supplied for each power voltage Vcc is applied to the fuse 1. If at this time the external voltage Vpp is raised to as high as 12V–20V, then a current flows through the fuse 1. As a result, the fuse 1 is blown out due to occurrence of Joule heat. Accordingly, the fuse 1 in this case serves as a memory element storing data "0".

to read out the data "0" stored by the fuse 1, the control circuit (not shown) outputs a read signal SR to the gate terminal of the N-channel MOS transistor 4. This turns on the N-channel MOS transistor 4. In this case, however, the fuse 1 is blown so that the external voltage Vpp is not being applied on the sense line 3. Due to this, in the read-out circuit 5 the voltage on the sense line 3 is not greater than the reference voltages. Thus, the read-out circuit 5 outputs dead-out data D "0".

On the other hand, in a state the fuse 1 is not blown or data "1" is stored on the fuse 1, when a read signal SR is inputted from the control circuit (not shown) to the gate terminal of the N-channel MOS transistor 4, the N-channel MOS transistor 4 tuns on. The fuse 1 in this case is not blown. Consequently, the voltage on the sense line 3 is pulled up so that in the read-out circuit 5 the voltage on the sense line 3 is higher than the reference voltage. Thus, the read-out circuit 5 outputs read-out data D "1". At this time the external voltage Vpp is nearly at the same as the power supply voltage Vcc so as not to flow an excessively great voltage through the fuse.

FIG. 6 shows a circuit configuration of a second conventional memory circuit. In this figure, the corresponding parts to those of FIG. 5 are denoted by the same reference numerals, and duplicative explanations thereof are omitted. In FIG. 6, there is not provided the N-channel MOS transistor 2 shown in FIG. 5, wherein a bias voltage Vcc, e.g. power supply voltage Vcc, in place of the external voltage Vpp is applied to the fuse 1. This bias voltage Vcc is a voltage to be applied to various parts of the memory circuit. Meanwhile, the fuse 1 is to be flown out due to the laser light L radiated from a not-shown laser oscillator.

In the above configuration, where storing data "0" in the memory circuit of FIG. 6, the not-shown laser oscillator radiates laser light L onto the fuse 1. This blows out the fuse 1 due to heat produced by the laser light L. Therefore, the fuse 1 in this case serves as a memory element to store data "0".

Where reading out data "0" stored on the fuse 1, if a read signal SR is outputted from the control circuit (not shown) to the gate terminal of the N-channel MOS transistor 4, the N-channel MOS transistor 4 turns on. In this case, however, because the fuse 1 is in blown, the sense line 3 is in a state that no bias voltage Vcc is applied thereto. Thus, read-out data D "0" is outputted from the read-out circuit 5.

On the other hand, if a read signal SR is inputted from the control circuit (not shown) to the gate terminal of the N-channel MOS transistor 4 in the state that the fuse 1 is not in a blown state, or in a state "1" data is stored on the fuse 1, then the N-channel MOS transistor 4 turns on. In this case, the voltage on the sense line 3 is pulled up because the fuse 1 is not in blown. Accordingly, read-out data D "1" is outputted from the read-out circuit 5.

The conventional memory circuit of FIG. 5, however, uses two systems of power supplies including a power supply for biasing and an external power supply for blowing the fuse 1 out. This results in a problem that the conventional memory circuit is complicated in circuit configuration because of using two power supply systems.

On the other hand, the conventional memory circuit of FIG. 6 radiates laser light L to the fuse 1 thereby performing data writing. However, such write operation is possible only before mounting the memory circuit in a package (not shown). That is, the conventional memory circuits have an disadvantage that data writing is impossible to perform after mounting the memory circuit in a package resulting in poor usability.

SUMMARY OF THE INVENTION

It is therefore an object of the present invention to provide a memory circuit which is capable of writing data with a simplified configuration and hence being improved in usability.

In accordance with the present invention, a memory circuit formed on a semiconductor substrate, comprises: a fuse having one end connected to a power supply potential to have a disconnect/connect state storing data 0/1; a switching element inserted between the other end of the fuse and a ground; a read-out circuit for reading out data stored on the fuse; a drive control means for driving and controlling the switching element when writing to the fuse.

With this configuration, where data 1 is to be stored on the fuse the drive control means does not drive the switching element. Consequently, no current flows through the fuse so that the fuse not blown out stores data 1. This allows the data 1 to be read out of the read-out circuit.

Meanwhile, where data 0 is to be stored on the fuse, the switching element is driven by the drive control means. This connects the internal power supply to the ground through the fuse and switching element. The fuse is blown out by a large current flowing through it, being stored with data 0. This allows the data 0 to be read out of the read-out circuit.

In this manner, the above invention is configured such that the fuse is connected to the internal power supply and the switching element is provided to control a current to flow through the fuse, thus not requiring an external power supply as needed in the conventional. In this invention, because data writing/reading is possible with a single power supply (internal power supply), the power supply circuit can be simplified in configuration.

Furthermore, because this invention does not require laser light needed in the conventional, even after packaging the memory circuit, data writing is possible using the switching element and internal power supply thus improving usability.

Also, in the memory circuit, the switching element is formed by a thyristor, and the drive control means turns on the thyristor when writing data 0 to the fuse, and turns off the thyristor when writing data 1 to the fuse.

With this structure, when the thyristor is turned on by the drive control means, the internal power source is connected to the ground through the fuse and thyristor so that the fuse is blown by a large current flowing through it and data 0 is stored on the fuse. This allows the data 0 to be read out of the read-out circuit.

On the other hand, in a state that the thyristor is turned off by the drive control means, the fuse is not blown because no current flows through it and data 1 is stored on the fuse. This allows the data 1 to be read out of the read-out circuit.

In this manner, this invention is configured such that the fuse is connected to the internal power supply and the thyristor is provided to control a current to flow through the fuse, similarly to the above invention. Thus, the power supply circuit can be simplified in configuration and hence improved in usability.

In accordance with the present invention, a memory circuit formed on a semiconductor substrate, comprises: a memory array to which data is to be electrically erased/written; a write control means for controlling erasing/writing of data to the memory array only while being inputted with an operation signal; a fuse having one end connected to a power supply potential; a switching element inserted between the other end of the fuse and a ground; a signal supply means for producing the operation signal to be supplied to the write control means only while the fuse is not blown; and a drive control means for driving and controlling the switching element.

With this structure, in a state the fuse is not blown, the write control circuit performs writing/erasing to and from the memory array according to an operation signal supplied from the signal supply means. If the switching element is driven by the drive control means after ending the data writing to the memory array, the internal power supply is electrically connected to the ground through the fuse and switching element, thereby flowing a large current through the fuse. Due to this, the fuse is blown out to suspend the operation signal from being supplied to the write control means, thus providing a state that erasing/writing from or to the memory array is impossible to perform by the write control means.

In this manner, the use of the fuse and switching element can prohibit against writing to the rewritable memory array. Consequently, according to this invention, the simple structure that the fuse is blown by using a single power supply (internal power supply) can improve security for the rewritable memory array, thus further improving usability.

In accordance with the present invention, a memory circuit formed on a semiconductor substrate, comprises: a memory array to which data is to be electrically erased/written; a write control means for controlling erasing/writing of data to the memory array; a power supply control means for supplying power supply to the write control means only while being inputted with an operation signal; a fuse having one end connected to a power supply potential; a switching element inserted between the other end of the fuse and a ground; a signal supply means for producing the operation signal to be supplied to the power supply control means only while the fuse is not blown; and a drive control means for driving and controlling the switching element.

With this structure, in a state the fuse is not blown, the power supply control means supplies power to the write control means according to an operation signal supplied from the signal supply means. During this time, the write control means performs erasing/writing from or to the memory array. If the switching element is driven by the drive control means after ending the data writing to the memory array, the internal power supply is electrically connected to the ground through the fuse and switching element, thereby flowing a large current through the fuse. Due to this, the fuse is blown out to suspend the operation signal from being supplied to the power supply control means, suspending the supply of power to the write control means, thus providing a state that erasing/writing from or to the memory array is impossible to perform by the write control means.

In this manner, the simple structure that the fuse is blown by using a single power supply (internal power supply) can easily improve security for the rewritable memory array, further improving usability.

In accordance with the present invention, a thyristor is configured by PNP and NPN bipolar transistors to be parasitically formed in a CMOS semiconductor integrated circuit, the PNP bipolar transistor having a base electrode formed by a low concentration N-type diffusion layer, an emitter electrode formed by a P-type diffusion layer high in concentration in the low concentration N-type diffusion layer and a collector electrode formed by a low concentration P-type diffusion layer, the NPN bipolar transistor having a base electrode formed by a low concentration P-type diffusion layer, an emitter electrode formed by an N-type diffusion layer high in concentration in the low concentration P-type diffusion layer and a collector electrode formed by a low concentration N-type diffusion layer, and an N-type MOS transistor as the drive control means having a drain electrode connected to the low concentration N-type diffusion layer.

With this structure, a signal is supplied to the gate of the N-type MOS transistor as a driven control means for the thyristor to turn on the N-type MOS transistor. This turns on the thyristor formed by the PNP bipolar transistor and NPN bipolar transistor, keeping a large current to flow and resulting in blowout of the fuse.

In this manner, the utilization of a thyristor to be parasitically formed in the CMOS semiconductor integrated circuit makes it possible to configure the present memory circuit with easiness and at low cost.

DETAILED DESCRIPTION OF THE PREFERRED EMBODIMENTS

Embodiments of memory circuits 1 to 3 will now be described hereinunder with reference to the drawings.

(Embodiments 1)

Figure 1:
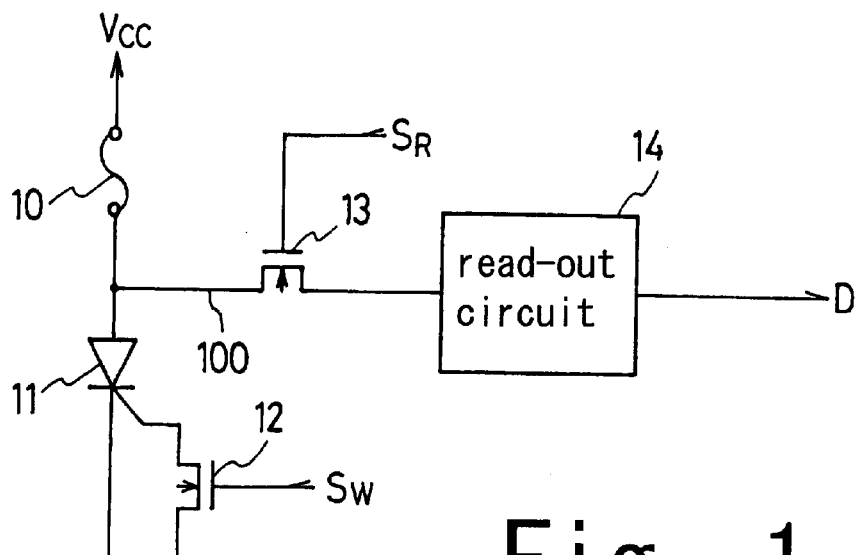
FIG. 1 shows a configuration of a memory circuit according to Embodiment 1 of the present invention.

Referring to FIG. 1, there is illustrated a block diagram showing a configuration of a memory circuit according to Embodiment 1 of the present invention. The memory circuit described hereinunder is formed on a semiconductor substrate. In the figure, a fuse 10 is formed of an aluminum-silicon based alloy, tungsten-silicide alloy, polysilicon or the like. The fuse 10 has one end to be applied with a bias voltage Vcc from a not-shown internal power supply. This bias voltage Vcc is the voltage for each part of the bias.

When a current of a given amount or greater passes through the fuse 10, it will be blown out due to Joules heat. The fuse 10 in a blown state stores data "0", and in a not-blown state stores data "1". A thyristor 11 has an anode terminal connected to an internal power source (not shown) through the fuse 10, and a cathode terminal being ground.

An N-channel MOS transistor 12 has a drain terminal connected to a gate terminal of the thyristor 11, and a source terminal being ground. The N-channel MOS transistor 12 is on/off-controlled by a disconnect signal SW. A sense line 100 connects between the other end of the fuse 10 (thyristor 11 anode terminal) and a read-out circuit 14, hereinafter referred.

The N-channel MOS transistor 13 is inserted on the sense line 100 to have a drain terminal connected to a fuse 10 side and a source terminal connected a read-out circuit 14 side. The N-channel MOS transistor 13 is on/off-controlled by a read signal SR inputted to a gate terminal thereof.

The read-out circuit 14 serves as a sense amplifier to compare a voltage on the sense line 100 with a reference voltage, thereby reading out a state of the fuse 10 (memory data) outputted as read-out data D. Specifically, the read-out circuit 14 outputs read-out data D "1" when the voltage on the sense line 100 is higher than the reference voltage, and read-out data D "0" when the voltage on the sense line 100 is equal to or lower than the reference voltage.

Figure 2:
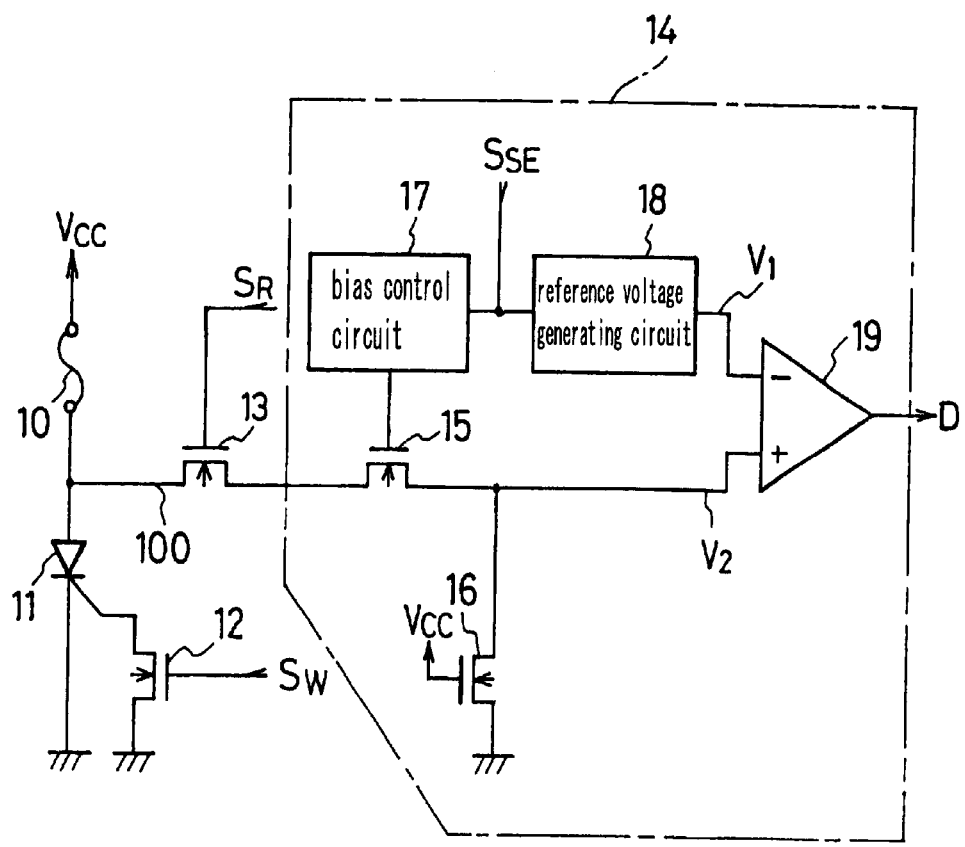
FIG. 2 shows a configuration of a read-out circuit 14 shown in FIG. 1.

Referring to FIG. 2, there is illustrated a configuration of the read-out circuit 14. In the read-out circuit 14, an N-channel MOS transistor 15 is inserted on the sense line 100 in a manner similar to the N-channel MOS transistor 13. The N-channel MOS transistor 15 has a drain terminal connected to the source terminal of the N-channel MOS transistor 13, and a source terminal connected to a +terminal of a comparator 19, hereinafter referred.

An N-channel MOS transistor 16 has a drain terminal connected to the source terminal of the N-channel MOS transistor 15, and a source terminal being ground. The N-channel MOS transistor 16 has a gate terminal connected to a not-shown internal power supply. A bias voltage Vcc is applied to the gate terminal.

A bias control circuit 17 is to supply a bias voltage to the gate terminal of the N-channel MOS transistor 15. When inputted by a sense enable signal S SE from a not-shown control circuit, the bias control circuit 17 supplies a bias current. A reference voltage generating circuit 18 outputs a reference voltage V1 to a—terminal of the comparator 19 when inputted by a sense enable signal S SE. Here, the reference voltage V1 is set higher than a voltage on the sense line 100 (voltage V2 to be compared) when the fuse 10 is not blown.

The comparator 19 compares a reference voltage V1 with a voltage V2 to be compared. The comparator 19 outputs "1" as read-out data D when the voltage V2 to be compared is higher than the reference voltage V1, and "0" as read-out data D when the voltage V2 to be compared is equal to or lower than the reference voltage V1.

The store data "0" on the memory circuit of FIG. 2 in the above configuration, a disconnect signal SW is inputted from the not-shown control circuit to the gate terminal of the N-channel MOS transistor 12. This turns on the N-channel MOS transistor 12 to thereby trigger the gate of the thyristor 11.

Due to this, the thyristor 11 is turned on allowing a current to flow through the fuse 10. Thus, the fuse 10 is blown out by Joule heat caused due to the current. The fuse 10 in this case serves as a memory element to store data "0".

To read out data "0" stored on the fuse 10, when a read signal SR is outputted from the control circuit (not shown) to the gate terminal of the N-channel MOS transistor 13, then the N-channel MOS transistor 13 is turned on. In this case, if it is assumed that a bias voltage Vcc is being applied to the gate terminal of the N-channel MOS transistor 16, the N-channel MOS transistor 16 is rendered in an on state.

It is further assumed that a sense enable signal S SE is inputted to the bias control circuit 17 and reference voltage generating circuit 18. The N-channel MOS transistor 15 is rendered on due to a bias voltage supplied from the bias control circuit 17. On the other hand, a reference voltage V1 is outputted from the reference voltage generating circuit 18 to the—terminal of the comparator 19.

Consequently, because in this case the fuse 10 is blown out, a voltage V2 (potential) to be compared on the sense line 100 is pulled down through the N-channel MOS transistor 16. From this, the comparator 19 outputs "0" of read-out data D because the voltage V2 to be compared is equal to or lower than the reference voltage V1.

Meanwhile, if a read signal SR is inputted from the control circuit (not shown) to the gate terminal of the N-channel MOS transistor 13 in a state the fuse 10 is not blown, in other words, in a state data "1" is stored on the fuse 10, then the N-channel MOS transistor 13 is turned on.

In this case, because the fuse 10 is not blown, the voltage V2 to be compared on the sense line 100 is pulled up through the N-channel MOS transistor 15, N-channel MOS transistor 13 and fuse 10. Due to this, the comparator 19 outputs "1" of read-out data D because the voltage V2 to be compared is higher than the reference voltage V1.

As described above, according to the memory circuit of Embodiment 1, because the fuse 10 is connected to the internal power supply and the thyristor 11 is provided to control a current to flow through the fuse 10, no external power supply is required differently from the conventional. Accordingly, the memory circuit of Embodiment 1 can write and read data by merely using the single power supply (internal power supply), thus simplifying power supply circuit configuration.

Furthermore, the memory circuit of Embodiment 1 does not require laser light as needed in the conventional. Accordingly, even after the memory circuit (semiconductor circuit) is packaged, it is possible to write data by using the thryristor 11 and internal power supply, thus improving usability.

(Embodiment 2)

Figure 3:
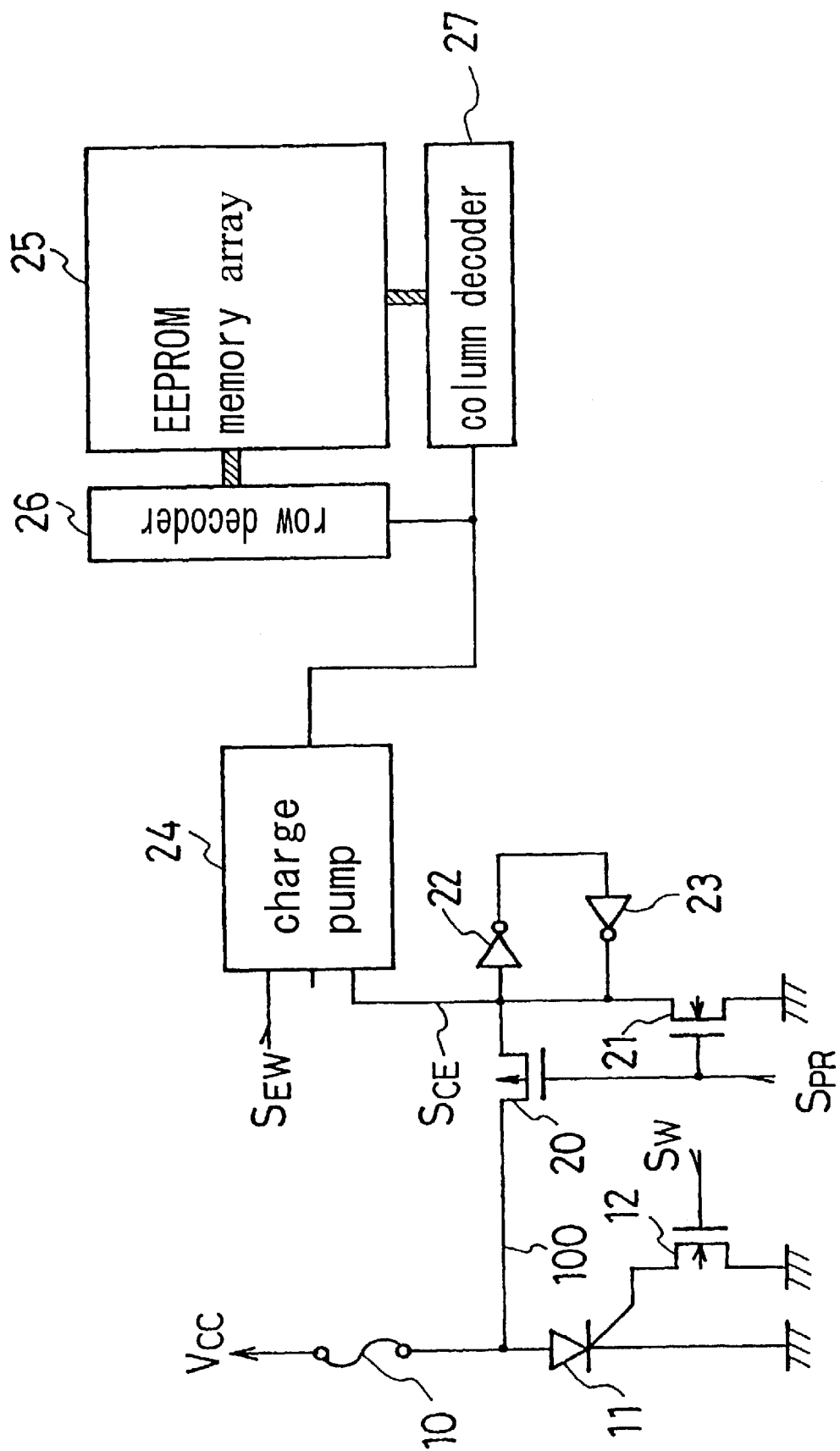
FIG. 3 shows a configuration of a memory circuit according to Embodiment 2 of the invention.

Referring to FIG. 3, there is illustrated a block diagram showing a configuration of a memory circuit according to Embodiment 2 of the invention. In the figure, the corresponding parts to those of FIG. 2 are denoted by the same reference numerals, omitting explanations thereof. In FIG. 3, there are provided a P-channel MOS transistor 20, an N-channel MOS transistor 21, an inverter 22, an inverter 23, a charge pump 24, an EEPROM (Electrically Erasable Programmable ROM) memory array 25, a row decoder 26 and a column decoder 27, in place of the N-channel MOS transistor 13 and read-out circuit 14 of FIG. 2.

In FIG. 3, the P-channel MOS transistor 20 is inserted on the sense line 100 to have a source terminal connected to a side of the fuse 10. The N-channel MOS transistor 21 has a drain terminal connected to a drain terminal of the P-channel MOS transistor 20, and a source terminal being ground.

The P-channel and N-channel MOS transistor 20, 21 are each on/off-controlled by a power-on reset signal S PR inputted to a gate terminal thereof. Here, the power-on reset signal S PR assumes a high level when turning on the power. This is a signal to reset a latch circuit configured by the inverters 22 and 23.

The charge pump 24 acts as a booster circuit when data is written to the EEPROM memory array 25, hereinafter referred. The charge pump 24 is inputted with an EEPROM write signal S EW from the not-shown control circuit, and outputs a high voltage when the charge pump enable signal S CE is at a high level. That is, the charge pump 24 becomes a writable state when the charge pump enable signal S CE is at a high level, and a non-writable state when the charge pump enable signal S CE is at a low level.

The charge pump 24 acts as a booster circuit when data is written to the EEPROM memory array 25, hereinafter referred. The charge pump 24 is inputted with an EEPRPM write signal S EW from the not-shown control circuit, and outputs a high voltage when the charge pump enable signal S CE is at a high level. That is, the charge pump 24 becomes a writable state when the charge pump enable signal S CE is at a high level, and a non-writable state when the charge pump enable signal S CE is at a low level.

The EEPROM memory array 25 constitutes a memory that is capable of electrically erasing/writing data, which is formed by a plurality of memory cells arranged in a matrix form. This EEPROM memory array 25 has, in a row direction, an N number of word lines and, in a column direction, an M number of data lines. Memory cells are arranged at intersection of the word lines of N in the number and the data lines of M in the number. In the EEPROM memory array 25, when a high voltage is applied to the memory cell, its data is rewritten from "1" to "0" or from "0" to "1".

The row decoder 26 selects a row-direction word line of the EEPROM memory array 25 based on an address signal inputted from the not-shown control circuit so that it applies to this word line a high voltage supplied from the charge pump 24.

The column decoder 27 selects a row-direction data line of the EEPROM memory array 25 based on an address signal inputted from the not-shown control circuit so that it applies to this data line a high voltage supplied from the charge pump 24. That is, a high voltage is applied to a memory cell at an intersection of a word line as selected by the row decoder 26 and a data line selected by the column decoder 27. Due to this, the data on the same memory cell is rewritten from "1" to "0" or "0" to "1".

In the above configuration, when a bias voltage Vcc is applied to each portion of the memory circuit of FIG. 3, a high-level power-on reset signal S PR is inputted to the respective gate terminals of the P-channel MOS transistor 20 and the N-channel MOS transistor 21. This turns the P-channel MOS transistor 20 off and the N-channel MOS transistor 21 on.

In this case, because the drain terminal voltage of the p-channel MOS transistor 20 is pulled down to a ground potential through the N-channel MOS transistor 21, a low level signal is inputted to the inverter 22 so that the inverter 22 has an output at a high level. Furthermore, the inverter 23 has an output at a low level. That is, in this case, a low-level change pump enable signal S CE is latched by the inverter 22 and inverter 23 whereby a latch circuit configured by the inverters 22 and 23 is reset.

In the case that the power-on reset signal S PR changes from the high level to a low level, the P-channel MOS transistor 20 turns from off to on while the N-channel MOS transistor 21 turns from on to off. Due to this, because the drain terminal voltage of the P-channel MOS transistor 20 is pulled up by the bias voltage Vcc through the P-channel transistor 20 and fuse 10, the input of the inverter 22 changes from the low level to a high level.

As a result, the output change of the inverter 22 from the high to low level changes an output of the inverter 23, or charge pump enable signal S CE, from the low level to a high level.

Accordingly, in this case the charge pump 24 is in an enable state because a high level of charge pump enable signal S CE is inputted to the charge pump 24. If in this state an EEPROM write signal S EW is inputted from the not-shown control circuit to the charge pump 24, the charge pump 24 outputs a high voltage to the both the row decoder 26 and the column decoder 27.

Furthermore, if in this state an address signal is inputted from the not-shown control circuit to both the row decoder 26 and the column decoder 27, the above high voltage is applied to a word line in the row direction and a data line in the column direction of the EEPROM memory array 25 through the row decoder 26 and column decoder 27. Due to this, a memory cell at an intersection of the word and data lines can be rewritten of data from "1" to "0" or from "0" to "1".

Thereafter, data renewals are made on the relevant memory cell of the EEPROM memory array 25 each time an EEPRPM write signal S EW is inputted to the charge pump 24 and an address signal is inputted to the row decoder 26 and column decoder 27.

In the case that a disconnect signal SW is inputted from the not-shown control circuit to the gate terminal of the N-channel MOS transistor 12 at a time point that all data has been written to the EEPROM memory array 25, i.e. at a time point that renewal becomes unnecessary, the N-channel MOS transistor 12 turns on to apply trigger to a gate of the thyristor 11.

This turns on the thyristor 11 to flow a current through the fuse 10. Thus, the fuse 10 blows out due to Joule heat caused by the current. If in this state a power is again turned on, a high level of power-on reset signal S PR is inputted to gate terminals of the P-channel MOS transistor 20 and N-channel MOS transistor 21 in a manner similar to the above operation. This causes the P-channel MOS transistor 20 to turn off and the N-channel MOS transistor 21 to turn on.

In this case, low-level charge pump enable signals S CE are latched on the inverters 22 and 23, similarly to the above operation. When the power-on reset signal S PR becomes from high to low level, the P-channel MOS transistor 20 turns from off to on while the N-channel MOS transistor 21 turns from on to off. In this case, however, the fuse 10 is blown. Consequently, even if the P-channel MOS transistor 20 be turned on, the charge pump enable signal S CE remains at the low level.

Accordingly, the charge pump 24 is inputted with the low level charge pump enable signal S CE and hence the charge pump 24 remains in an inoperative state. If in this state an EEPROM write signal S EW be inputted from the not-shown control circuit to the charge pump 24, no high voltage is outputted from the charge pump 24. That is, in a state the fuse 10 is blown, writing is impossible for the EEPROM memory array 25.

As explained above, it is possible for the memory circuit of Embodiment 2 to prohibit writing to the rewritable memory (EEPROM memory array 25) by using the fuse 10 and thyristor 11. According to the memory circuit of Embodiment 2, the rewritable memory array can be easily improved in security by a simple configuration using a single power supply (internal power supply) to cause the fuse 10 to blow, further improving usability.

Embodiment 3

Figure 4:
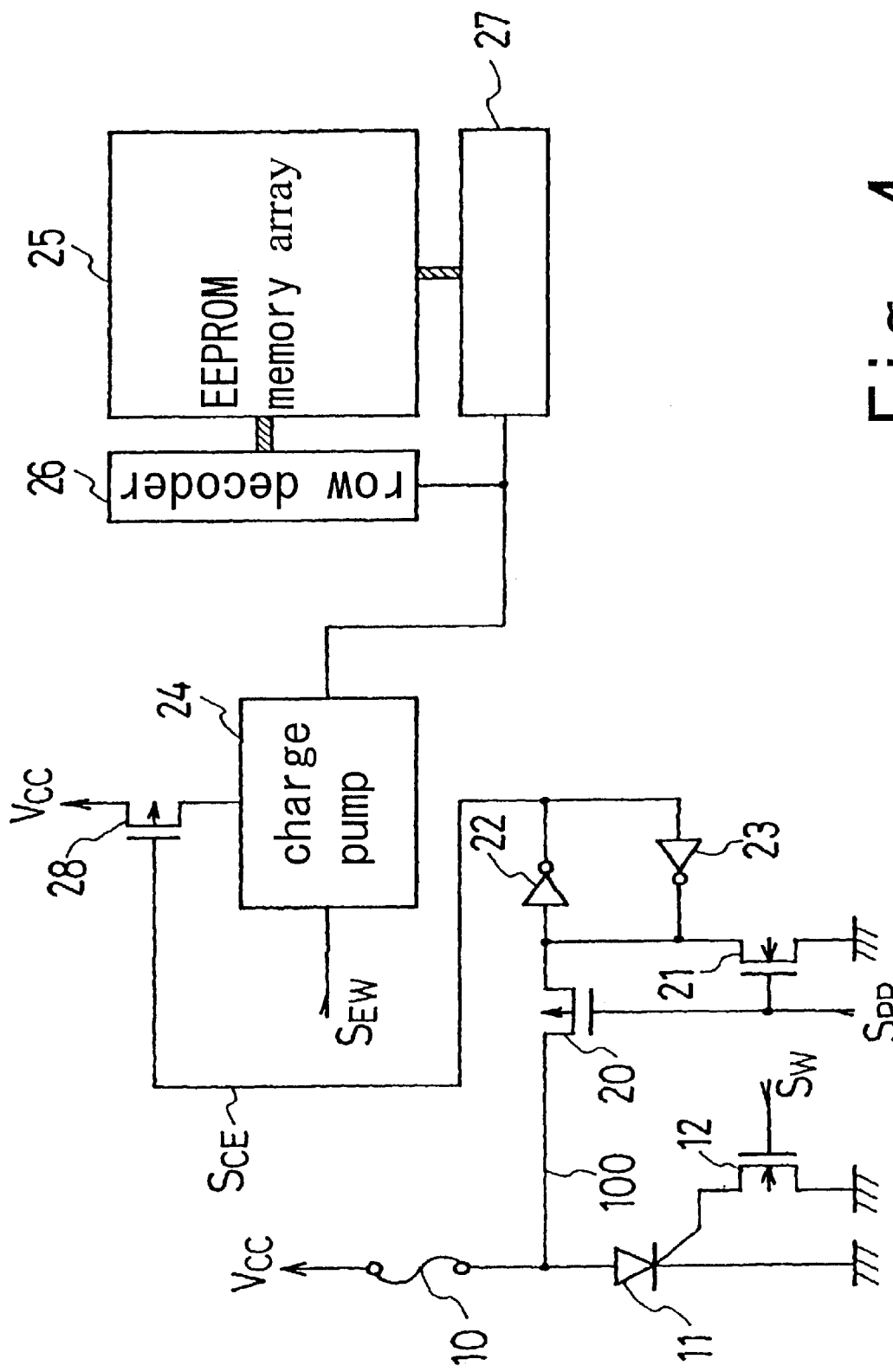
FIG. 4 shows a configuration of a memory circuit according to Embodiment 3 of the invention.
Figure 5:
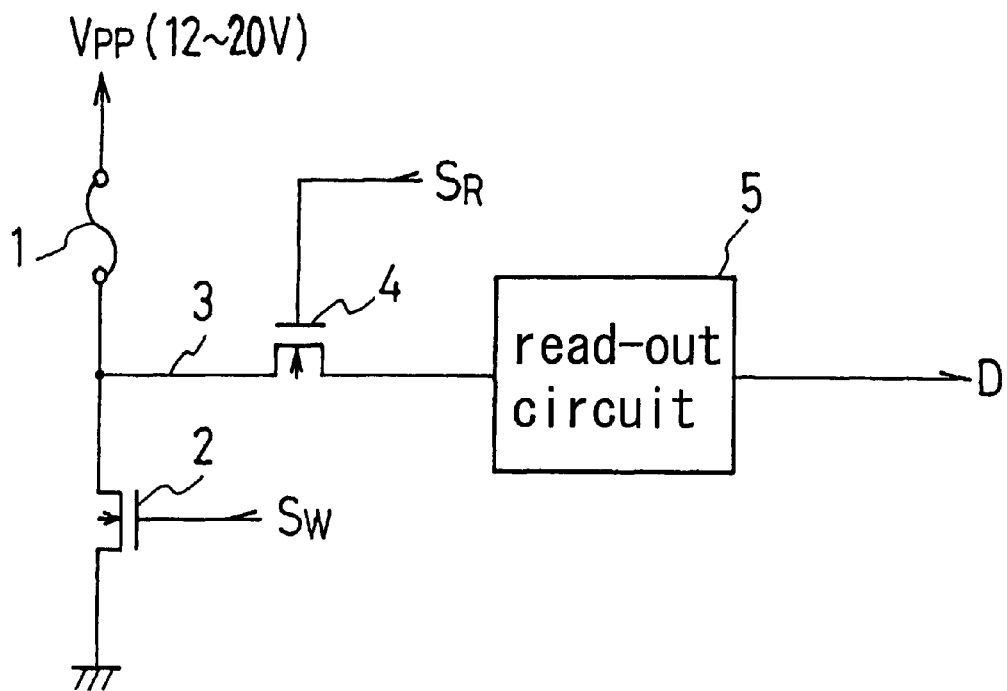
FIG. 5 shows circuit configuration 1 of a conventional memory circuit.
Figure 6:
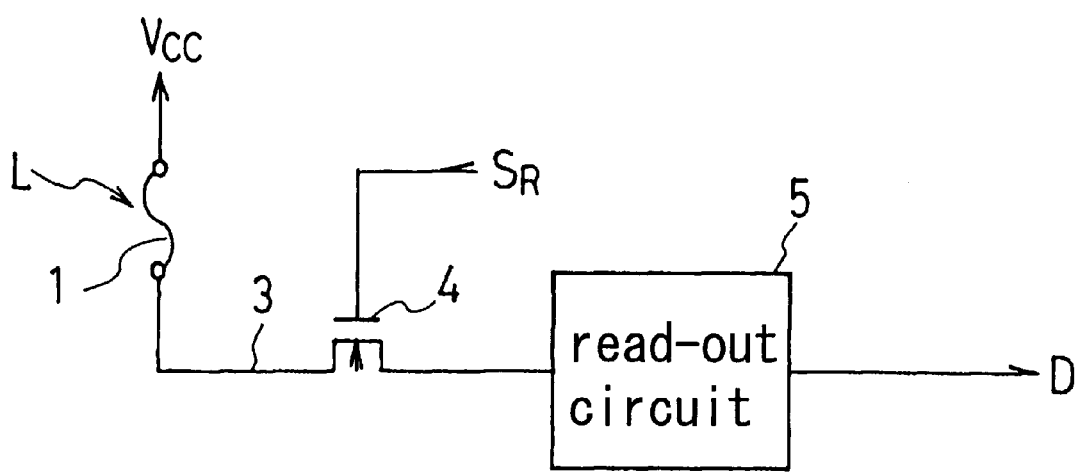
FIG. 6 shows circuit configuration 2 of a conventional memory circuit.

Referring to FIG. 4, there is illustrated a block diagram showing a configuration of a memory circuit according to Embodiment 3 of the invention. In this figure, the corresponding parts to those of FIG. 3 are denoted by the same reference characters, and duplicative explanations thereof are omitted. In FIG. 4, there is newly provided a P-channel MOS transistor 28.

The P-channel MOS transistor 28 is inserted on a power supply line connecting between an internal power supply (not shown) supplying a bias voltage Vcc to the charge pump 24 and the charge pump 24. That is, the P-channel MOS transistor 28 has a source terminal connected to a side of the internal power supply (not shown) and a drain terminal connected to a side of the charge pump 24.

Also, the P-channel MOS transistor 28 has a gate terminal connected to an output terminal of an inverter 22. To this gate terminal is inputted an output signal of the inverter 22 (charge pump enable signal S CE).

In the above configuration, If a bias voltage Vcc is applied to various portions of the memory circuit of FIG. 4, a high level of power-on reset signal S PR is inputted to respective gate terminals of the P-channel MOS transistor 20 and the N-channel MOS transistor 21. This causes the P-channel MOS transistor 20 to turn off and the N-channel MOS transistor 21 to turn on.

In this case, because the P-channel MOS transistor 20 at its drain terminal is pulled down to a ground potential through the N-channel MOS transistor 21, a low level signal is inputted to the inverter 22. The output of the inverter 22, or charge pump enable signal S CE, becomes a high level.

Accordingly, because in this case the charge pump enable signal S CE is at a high level, the P-channel MOS transistor 28 is rendered off. A bias voltage Vcc is not yet applied to the charge pump 24.

In the case that the power-on reset signal S PR becomes from a high to low level, the P-channel MOS transistor 20 turns from off to on. On the other hand, the N-channel MOS transistor 21 turns from on to off. Due to this, the P-channel MOS transistor 20 at its drain terminal is pulled up by the bias voltage Vcc through the P-channel MOS transistor 20 and fuse 10. Accordingly, the input to the inverter 22 changes from a low to high level.

As a result, the output of the inverter 22 (charge pump enable signal S CE) changes from a high to low level, thereby turning the P-channel MOS transistor 28 from off to on. Due to this, the charge pump 24 is supplied with the bias voltage Vcc, being put in an enable state.

In this state, an address signal is inputted from the not-shown control circuit to both the row decoder 26 and the column decoder 27, the high voltage is applied to a word line in the row direction and data line in the column direction of the EEPROM memory array 25 similarly to the operation mentioned before. Due to this, a memory cell at an intersection of the word line and data line can be rewritten of data from "1" to "0" or "0" to "1".

Thereafter, the relevant memory cell of the EEPROM memory array 25 is renewed of data each time an EEPRPM write signal S EW is inputted to the charge pump 24 and an address signal is inputted to the row decoder 26 and column decoder 27.

When data renewal becomes unnecessary to the EEPROM memory array 25, if a disconnect signal SW is inputted to the gate terminal of the N-channel MOS transistor 12 from the not-shown control circuit, the N-channel MOS transistor 12 turns on thus applying trigger to the gate of the thyristor 11. This causes the fuse 10 to be blown out.

If in this state a power is again turned on, a high level of power-on reset signal S PR is inputted to the respective gate terminals of the P-channel MOS transistor 20 and N-channel MOS transistor 21 similarly to the operation mentioned before. This causes the P-channel MOS transistor 20 to turn off and the N-channel MOS transistor 21 to turn on.

When the power-on reset signal S PR becomes from a high to low level, the P-channel MOS transistor 20 turns from off to on and the N-channel MOS transistor 21 turns from on to off. In this case, however, the fuse 10 has been blown out. Consequently, the output of the inverter 22 (charge pump enable signal S CE) remains at a high level even if the P-channel MOS transistor 20 turns on.

Accordingly, the P-channel MOS transistor 28 at its gate terminal is still applied with a high-level charge pump enable signal S CE so that the P-channel MOS transistor 28 remains off. Consequently, the bias voltage Vcc is not applied to the charge pump 24. That is, the charge pump 24 is left inoperative. That is, in the state the fuse 10 is blown it is impossible to conduct write operation to the EEPROM memory array 25.

As explained above, according to the memory circuit of Embodiment 3, it is possible to improve security for the rewritable memory similarly to the memory circuit of Embodiment 2. Thus usability is further improved.

Embodiment 4

Figure 7:
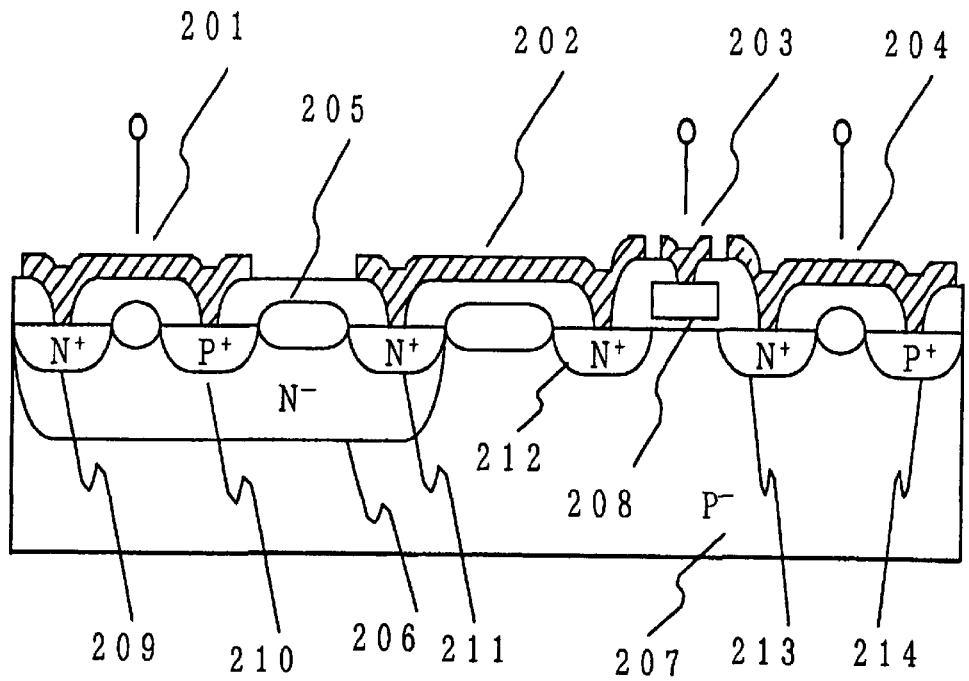
FIG. 7 shows a configuration of a thyristor according to Embodiment 4 of the invention.

Referring to FIG. 7, there is illustrated a sectional view showing a structure of a thyristor element according to Embodiment 4 of the invention.

The thyristor element utilizes a thyristor configuration to be parasitically formed in a CMOS semiconductor circuit on a P-type substrate 207. The thyristor comprises PNP and NPN bipolar transistors formed in the CMOS circuit, the PNP bipolar transistor having a base electrode formed by a low concentration N-type diffusion layer 206, an emitter electrode formed by a P-type diffusion layer 210 high in concentration formed in the low concentration N-type diffusion layer 206, and a collector electrode formed by a low concentration P-type diffusion layer 207. The NPN bipolar transistor has a base electrode formed by a low concentration P-type diffusion layer 207, an emitter electrode formed by an N-type diffusion layer 211 high in concentration formed in the low concentration P-type diffusion layer, and a collector electrode formed by a low concentration N-type diffusion layer. A fuse is connected to a metal electrode 201 as an anode while a metal electrode 204 as a cathode is connected to the ground thus being rendered at a low potential. A high level signal is applied to a gate electrode 203 of an NMOS transistor having N-type source and drain regions 212, 213 and an insulating film 208, and being connected to a metal electrode 202 as a gate of the thyristor. This turns on the thyristor to continuously flow a large current, resulting in blowout in the fuse connected to the anode.

Embodiment 5

Figure 8:
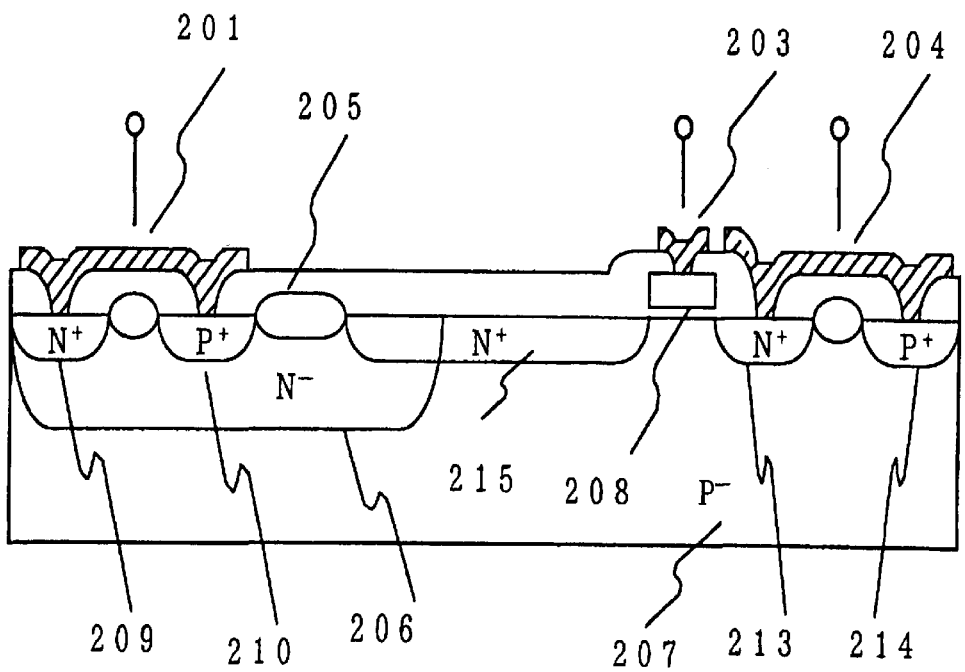
FIG. 8 shows a configuration of a thyristor according to Embodiment 5 of the invention.

FIG. 8 is a sectional view showing a configuration of thyristor element according to Embodiment 5 of the invention.

The basic structure is provided by a parasitically formed element in a CMOS semiconductor integrated circuit, similarly to the thyristor shown in Embodiment 4. In FIG. 8, a single N-type diffusion layer 215 is formed in place of the high-concentration N-type diffusion layer 211 to serve as a gate electrode of a thyristor of FIG. 7 and the high-concentration N-type diffusion layer to serve as a drain electrode of the N-type MOS transistor.

This configuration makes it possible to form the thyristor element in a smaller area.

As explained above, the present invention is configured such that the fuse is connected to the internal power supply and the switching element is provided to control a current to flow through the fuse, thus not requiring an external power supply as needed in the conventional. Because data writing/reading is possible with a single power supply (internal power supply), the power supply circuit can be simplified in configuration.

Furthermore, because there is no necessity of laser light needed in the conventional, even after packaging the memory circuit, data writing is possible using the switching element and internal power supply thus providing an effect of improving usability.

Also, the fuse is connected to the internal power supply and the thyristor is provided to control a current to flow through the fuse, similarly to the above invention. Accordingly, an effect is provided that the power supply circuit can be simplified in configuration and hence improved in usability.

Also, the use of the fuse and switching element can prohibit against writing to the rewritable memory array. Consequently, according to this invention, the simple structure that the fuse is blown by using a single power supply (internal power supply) can improve security for the rewritable memory array, thus providing an effect of further improving usability.

Furthermore, thyristor element forming the present memory circuit is constituted by PNP and NPN bipolar transistors parasitically formed in the CMOS semiconductor integrated circuit. Consequently, there is no necessity of a new manufacture process for device forming, thus providing an effect to form the present memory circuit with easiness and at low cost.

What is claimed is:

1. A memory circuit formed on a semiconductor substrate, comprising:
    a fuse having a first end connected to a power supply potential generated by a main power supply used to provide a bias voltage to components of the memory circuit so that the fuse has a disconnect/connect state for storing a bit of binary data based on whether or not the fuse has been blown by a current passing therethrough produced by the power supply potential;
    a switching element inserted between a second end of the fuse opposite the first end and a reference potential, and being capable of passing a current large enough to blow out the fuse based solely on the power supply potential;
    a read-out circuit for reading out the binary data bit stored by the fuse; and
    drive control means for driving and controlling the switching element when writing to the fuse so that the current passing through the fuse based solely on application of the power supply potential is large enough to blow out the fuse.

2. A memory circuit according to claim 1; wherein the switching element comprises a thyristor; and the drive control means includes means for turning on the thyristor when writing data having a value of 0 to the fuse and turning off the thyristor when writing data having a value of 1 to the fuse.

3. A memory circuit formed on a semiconductor substrate, comprising:
    a memory array to which data is to be electrically erased/written;
    write control means for controlling erasing/writing of data to the memory array only while being supplied with an operation signal;
    a fuse having a first end connected to a power supply potential generated by a main power supply used to provide a bias voltage to components of the memory circuit so that the fuse may be used for storing a bit of binary data based on whether or not the fuse has been blown by a current passing therethrough produced by the power supply potential;

a switching element inserted between a second end of the fuse opposite the first end and a reference potential, and being capable of passing a current large enough to blow out the fuse based solely on the power supply potential;

signal supply means for producing the operation signal to be supplied to the write control means only when the fuse has not been blown; and drive control means for driving and controlling the switching element when writing to the fuse so that the current passing through the fuse based solely on application of the power supply potential is large enough to blow out the fuse.

4. A memory circuit formed on a semiconductor substrate, comprising:

a memory array to which data is to be electrically erased/written;

write control means for controlling erasing/writing of data to the memory array;

high voltage supply control means for supplying a higher voltage than a power supply potential used for providing a bias voltage to components of the memory circuit, the higher voltage being supplied to the write control means only while the high voltage supply control means is being supplied with an operation signal;

a fuse having a first end connected to the power supply potential generated by a main power supply used to provide a bias voltage to components of the memory circuit so that the fuse may be used for storing a bit of binary data based on whether or not the fuse has been blown by a current passing therethrough produced by the power supply potential;

a switching element inserted between a second end of the fuse and a reference potential, and being capable of passing a current large enough to blow out the fuse based solely on the power supply potential;

signal supply means for producing the operation signal to be supplied to the high voltage supply control means only when the fuse has not been blown; and drive control means for driving and controlling the switching element when writing to the fuse so that the current passing through the fuse based solely on application of the power supply potential is large enough to blow out the fuse.

5. A memory circuit formed on a semiconductor substrate, comprising:

a fuse having a first end connected to a power supply potential generated by a main power supply used to drive other components of the memory circuit to have a disconnect/connect state for storing a bit of binary data based on whether or not the fuse has been blown by a current passing therethrough produced by the power supply potential;

a switching element comprising a thyristor inserted between a second end of the fuse opposite the first end and a reference potential;

a read-out circuit for reading out the binary data bit stored by the fuse; and drive control means comprising a MOS transistor for driving and controlling the thyristor to operate as the switching element when writing to the fuse;

wherein the thyristor comprises PNP and NPN bipolar transistors parasitically formed in a CMOS semiconductor integrated circuit, the PNP bipolar transistor having a base electrode formed by a low concentration N-type diffusion layer, an emitter electrode formed by a P-type diffusion layer high in concentration formed in the low concentration N-type diffusion layer and a collector electrode formed by a low concentration P-type diffusion layer, and the NPN bipolar transistor having a base electrode formed by a low concentration P-type diffusion layer, an emitter electrode formed by an N-type diffusion layer high in concentration formed in the low concentration P-type diffusion layer and a collector electrode formed by a low concentration N-type diffusion layer, and wherein the MOS transistor serving as the drive control means comprises an N-type MOS transistor having a drain electrode connected to the low concentration N-type diffusion layer.

6. A memory circuit comprising: a fuse having a first end connected to a power supply potential to have a disconnect/connect state storing binary data; a switching element comprising a thyristor inserted between a second end of the fuse and ground; a read-out circuit for reading out data stored on the fuse; and drive control means for driving and controlling the switching element when writing to the fuse.

7. A memory circuit according to claim 6; wherein the drive control means turns on the thyristor when writing a data value of 0 to the fuse and turns off the thyristor when writing a data value of 1 to the fuse.

8. A memory circuit according to claim 6; wherein the fuse, the switching element, the read-out circuit and the drive control means are formed in a semiconductor substrate.

9. A memory circuit according to claim 6; further comprising a rewritable memory array to which data may be electrically written and erased; write control means for controlling the writing and erasing of data to the memory array only while being supplied with an operation signal; and signal supply means for producing the operation signal only when the fuse has not been blown.

10. A memory circuit according to claim 6; further comprising a rewritable memory array to which data may be electrically written and erased; write control means for controlling the writing and erasing of data to the memory array; high voltage supply control means for supplying a higher voltage than a power supply voltage used for providing a bias voltage to components of the memory circuit, the higher voltage being supplied to the write control means only when the high voltage supply control means is being supplied with an operation signal; and signal supply means for producing the operation signal to be supplied to the high voltage supply control means only when the fuse has not been blown.

11. A memory circuit according to claim 6; wherein the drive control means comprises a MOS transistor.

12. A memory circuit according to claim 11; wherein the thyristor comprises PNP and NPN bipolar transistors parasitically formed in a CMOS semiconductor integrated circuit, the PNP bipolar transistor having a base electrode formed by a low concentration N-type diffusion layer, an emitter electrode formed by a P-type diffusion layer high in concentration formed in the low concentration N-type diffusion layer and a collector electrode formed by a low concentration P-type diffusion layer, and the NPN bipolar transistor having a base electrode formed by a low concentration P-type diffusion layer, an emitter electrode formed by an N-type diffusion layer high in concentration formed in the low concentration P-type diffusion layer, and a collector electrode formed by a low concentration N-type diffusion layer; and the drive control means comprises an N-type MOS transistor having a drain electrode connected to the low concentration N-type diffusion layer.

13. A memory circuit comprising: a power source voltage terminal for supplying a power source voltage for biasing internal components of the memory circuit; a fuse connected to the power source voltage terminal for storing a data bit based on whether or not the fuse has been blown by a current passing therethrough produced by the power source voltage; a first switching element inserted between the fuse and a reference potential for selectively allowing a current to pass through the fuse large enough to blow out the fuse; a read-out circuit for reading out the data bit stored by the fuse; and a second switching element for controlling the first switching element to selectively activate the first switching element to allow the current to pass through the fuse.

14. A memory circuit according to claim 13; wherein the first switching element comprises a thyristor.

15. A memory circuit according to claim 14; wherein the second switching element turns on the thyristor when writing data having a value of 0 to the fuse and turns off the thyristor when writing data having a value of 1 to the fuse.

16. A memory circuit according to claim 13; wherein the power source voltage terminal, the fuse, the first and second switching elements, and the read-out circuit are formed in a semiconductor substrate.

17. A memory circuit according to claim 13; further comprising a rewritable memory array to which data may be electrically written and erased; write control means for controlling the writing and erasing of data to the memory array so that data may be written or erased only when an operation signal is being supplied to the write control means; and signal supply means for producing the operation signal to be supplied to the write control means only when the fuse has not been blown.

18. A memory circuit according to claim 13; further comprising a rewritable memory array to which data may be electrically written and erased; write control means for controlling writing and erasing of data to the memory array; high voltage supply control means for supplying a higher voltage than a power supply voltage to the write control means only while the write control means is being supplied with an operation signal; and signal supply means for producing the operation signal to be supplied to the high voltage supply control means only when the fuse has not been blown.

19. A memory circuit according to claim 13; wherein the first switching element comprises a thyristor formed of PNP and NPN bipolar transistors parasitically formed in a CMOS semiconductor integrated circuit, the PNP bipolar transistor having a base electrode formed by a low concentration N-type diffusion layer, an emitter electrode formed by a P-type diffusion layer high in concentration formed in the low concentration N-type diffusion layer, and a collector electrode formed by a low concentration P-type diffusion layer, and the NPN bipolar transistor having a base electrode formed by a low concentration P-type diffusion layer, an emitter electrode formed by an N-type diffusion layer high in concentration formed in the low concentration P-type diffusion layer, and a collector electrode formed by a low concentration N-type diffusion layer; and the second switching element comprises an N-type MOS transistor having a drain electrode connected to the low concentration N-type diffusion layer.

\* \* \* \* \*